(12) United States Patent
Taniguchi (10) Patent No.: US 6,534,377 B2
(45) Date of Patent: Mar. 18, 2003

(54) CAPACITANCE ELEMENTS AND METHOD OF MANUFACTURING THE SAME

(75) Inventor: Koji Taniguchi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/977,273

(22) Filed: Oct. 16, 2001

(65) Prior Publication Data

US 2002/0094617 A1 Jul. 18, 2002

(30) Foreign Application Priority Data

Jan. 18, 2001 (JP) ........................................ 2001-010332

(51) Int. Cl.[7] .............................................. H01L 21/20
(52) U.S. Cl. ...................... 438/396; 438/239; 438/254; 438/255; 438/393; 438/397; 438/398; 438/399
(58) Field of Search ................................ 438/239, 250, 438/253, 254, 255, 256, 381, 386, 387, 393, 396, 397, 398, 399

(56) References Cited

U.S. PATENT DOCUMENTS 5,969,381 A * 10/1999 Zenke

* cited by examiner

Primary Examiner—Long Pham
(74) Attorney, Agent, or Firm—McDermott, Will & Emery (57) ABSTRACT

Providing a capacitance element which prevents short-circuit between adjacent storage node layers caused by an adhering conductive foreign matter.

A method of manufacturing a capacitance element in which a plurality of aperture portions are formed in an insulation layer on a semiconductor substrate and a storage node layer is formed at inner surfaces of the aperture portions, comprising the steps of forming a plurality of aperture portions in an insulation layer from a surface of a silicon oxide film, forming a conductive layer so as to cover the insulation layer and the silicon oxide film, removing the conductive layer on the silicon oxide film so that the conductive layer remaining inside the aperture portions becomes storage node layers, and removing silicon oxide film.

6 Claims, 12 Drawing Sheets

CAPACITANCE ELEMENTS AND METHOD OF MANUFACTURING THE SAME

BACKGROUND OF THE INVENTION

The present invention relates to a capacitance element and a method of manufacturing the same, and more particularly, to a concave type capacitance element and a method of manufacturing the same.

Figure 7:
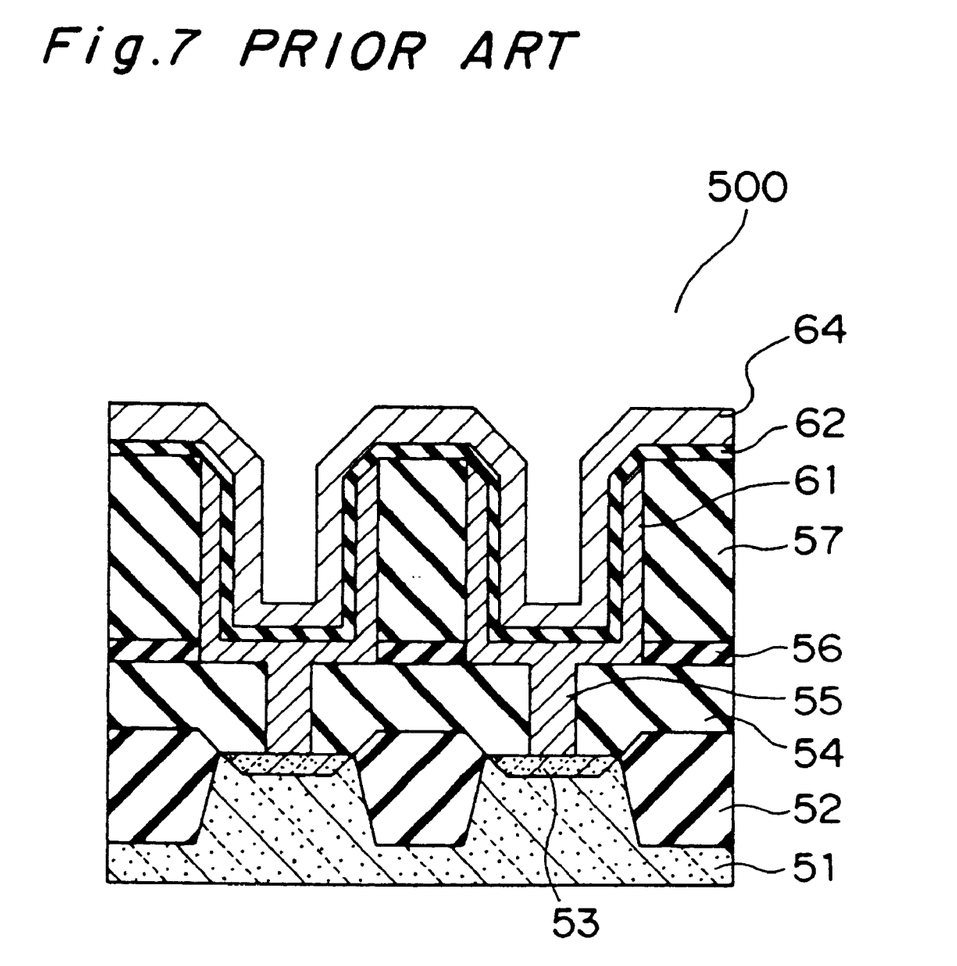
FIG. 7 is a cross sectional view of a conventional capacitance element.
Figure 8A:
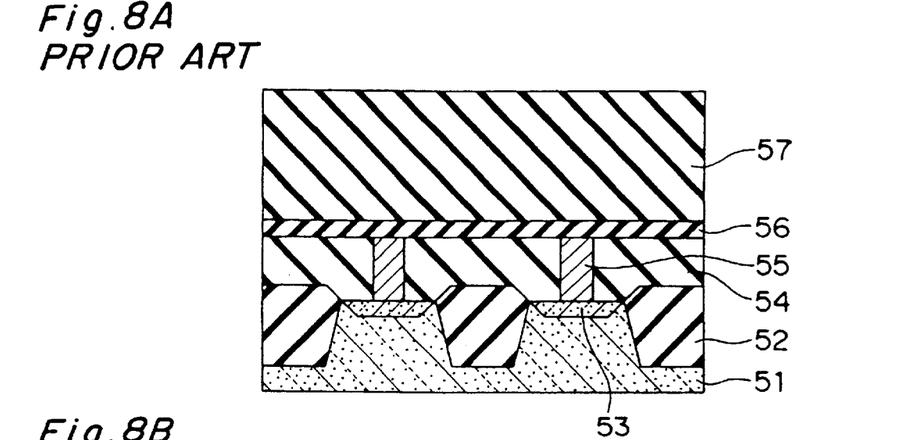
FIGS. 8A–8C are cross sectional view of manufacturing steps of the conventional capacitance element.
Figure 8B:
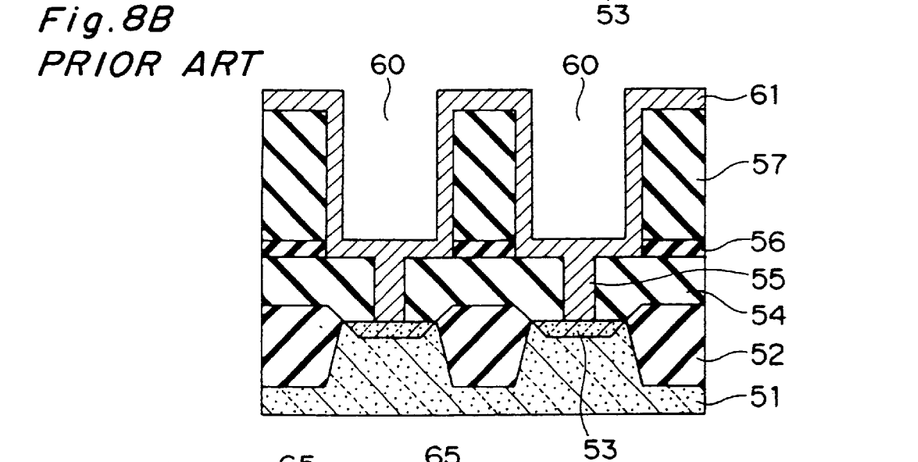
Figure 8C:
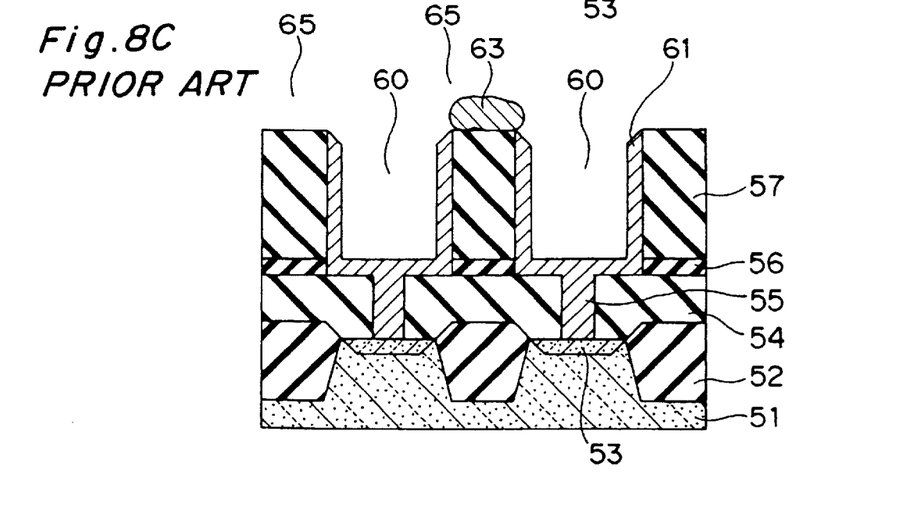

FIG. 7 is a cross sectional view of a conventional concave type capacitance element, which is denoted generally at 500. FIGS. 8A–8C is a cross sectional view of manufacturing steps of the capacitance element 500. The capacitance element 500 will now be described with reference to FIGS. 8A–8C.

Among the manufacturing steps of the conventional capacitance element 500, first, as shown in FIG. 8A, insulation regions 52 and active regions 53 sandwiched by the insulation regions 52 are formed on the surface of silicon substrate 51. Following this, silicon oxide layers 54 are formed so as to cover the surface of the silicon substrate 51. Aperture portions (not shown) are formed in the silicon oxide layers 54, and polycrystalline silicon is buried in the aperture portions so that plugs 55 are formed. Further, a silicon nitride film 56 and a silicon oxide layer 57 are deposited.

Next, as shown in FIG. 8B, the silicon oxide layer 57 and the silicon nitride film 56 are etched into an approximately cylindrical shape using a photoresist (not shown) as a mask, whereby aperture portions 60 are formed. Following this, a storage node (SN) layer 61 of polycrystalline silicon doped with phosphorus, for instance, is formed so as to cover the entire surface. The storage node layer 61 is electrically connected with the active regions 53 of the silicon substrate 51 through the plugs 55.

Next, as shown in FIG. 8C, a photoresist (not shown) is formed inside the aperture portions 60, and the storage node layer 61 is etched so that the storage node layer 61 remains only within the aperture portions 60. This allows an isolation wall 65 to isolate the storage node layers 61 of adjacent capacitors from each other.

Following this, a capacitor isolation film 62 of silicon nitride, for example, and a cell plate layer 64 of polycrystalline silicon, for example, are formed successively.

Through these steps described above, the capacitance element 500 as that shown in FIG. 7 is completed in which the adjacent capacitors are isolated from each other by the isolation wall 65.

Figure 9:
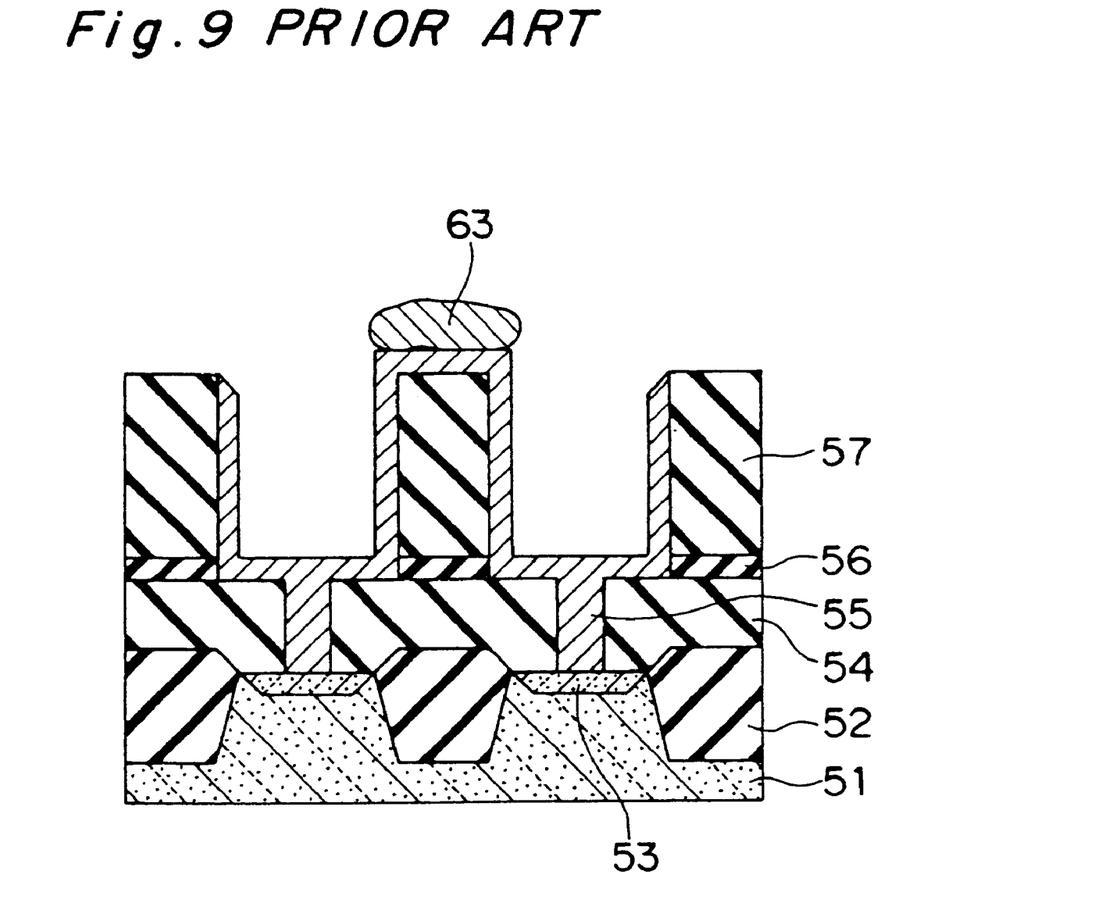
FIG. 9 is a cross sectional view of manufacturing steps of the conventional capacitance element.

During the manufacturing steps of the capacitance element 500, isolation between the storage node layers 61 of the adjacent capacitors is insufficient and an inconvenience therefore occurs that the capacitors short-circuit with each other. For instance, as shown in FIG. 9, when a foreign matter 63 adheres onto the storage node layers 61 on the isolation wall 65, the storage node layers 61 fail to be isolated from each other. However, it is possible to find such an inconvenience through an electric inspection (wafer test) on the capacitance element 500 after the manufacturing steps.

However, there is a situation as that shown in FIG. 8C that the adjacent storage node layers 61 short-circuit with each other as a conductive foreign matter 63 in an etching solution adheres onto the isolation wall 65 during etching of the storage node layers 61. In such a situation, since the short-circuit of the adjacent storage node layers 61 is on a smaller scale as compared with such an inconvenience as that shown in FIG. 9, it is more difficult to find the inconvenience by the wafer test and eliminate the inconvenience in advance.

As a result, the capacitance element 500 with such an inconvenience is used as it is directly as a product, which causes a failure in the market.

SUMMARY OF THE INVENTION

Noting this, the present invention aims at providing a capacitance element which prevents short-circuit induced by an adhering conductive foreign matter between adjacent storage node layers.

More particularly, the present invention is directed to manufacturing method of a capacitance element in which a plurality of aperture portions are formed in an insulation layer on a semiconductor substrate and a storage node layer is formed in the inner surfaces of the aperture portions, comprising: a step to form an insulation layer on a semiconductor substrate; a step to form a silicon oxide film on the insulation layer; a step to form a plurality of aperture portions in the insulation layer from the surface of the silicon oxide film; a step to form a conductive layer so as to cover the insulation layer and the silicon oxide film; a step to remove the conductive layer on the silicon oxide film so that the conductive layer remaining inside the aperture portions becomes storage node layers; a silicon oxide film removing step to remove the silicon oxide film; and a step to successively form a capacitor insulation film and a cell plate layer so as to cover the storage node layers.

Using this manufacturing method, it is possible to remove a conductive foreign matter together with the silicon oxide film, and therefore, prevent short-circuit induced by an adhering conductive foreign matter between the adjacent storage node layers.

Further, the present invention is directed to a manufacturing method, further comprising a step to form a silicon nitride film between the insulation layer and the silicon oxide film, wherein the silicon oxide film removing step is a step to etch back the silicon oxide film using the silicon nitride film as an etching stopper.

This is because it is possible to selectively remove the silicon oxide film by means of this step.

Further, the present invention is directed to a manufacturing method wherein the insulation layer is formed by a CVD silicon oxide layer formed by a CVD method while the silicon oxide film is formed by a coated silicon oxide film formed by a coating method, and the silicon oxide film removing step is a step to selectively etch the coated silicon oxide film using a hydrofluoric acid solution.

This is because it is possible to selectively remove the silicon oxide film by means of this step.

It is preferable that the CVD silicon oxide layer is formed by one layer selected between a BPSG layer and a TEOS layer, and the coated silicon oxide layer is formed by a SOG film.

Meanwhile, the present invention is directed also to a manufacturing method of a capacitance element in which a plurality of aperture portions are formed in an insulation layer on a semiconductor substrate and a storage node layer is formed at inner surfaces of the aperture portions, comprising: a step to form an insulation layer on a semiconductor substrate; a step to form a silicon nitride film on the insulation layer; a step to form a plurality of aperture portions in the insulation layer from the surface of the silicon nitride film; a step to selectively etch the insulation layer at side walls of the aperture portions while coating the surface of the insulation layer with the silicon nitride film so that the silicon nitride film projects like a hood from the top surface of the insulation layer; a step to form a conductive layer so as to cover the insulation layer and the silicon nitride film; a step to remove the conductive layer on the top surface and side surfaces of the silicon nitride film so that the conductive layer remaining inside the aperture portions becomes storage node layers; and a step to successively form a capacitor insulation film and a cell plate layer so as to cover the storage node layers.

The silicon nitride film is formed on the storage node layers in the manufacturing method, and therefore, it is possible to prevent short-circuit between the adjacent storage node layers.

It is preferable that the insulation layer is formed by a silicon oxide layer, and the selective etching step is a step to selectively etch, with a hydrofluoric acid solution, the silicon oxide film at the side walls of the aperture portions using the silicon nitride film as an etching mask.

The present invention is further directed to a capacitance element comprising a plurality of storage node layers insulated from each other, characterized in comprising: an insulation layer; a plurality of aperture portions formed at intervals from each other in the insulation layer; an isolation wall formed by the insulation layer sandwiched by the aperture portions; storage node layers formed so as to coat the inner surfaces of the aperture portions; a capacitor insulation film formed so as to coat the storage node layers; and a cell plate layer formed so as to coat the capacitor insulation film, wherein the upper surface of the isolation wall is etched and the storage node layers project above the upper surface of the isolation wall.

Further, the present invention is directed to a capacitance element wherein the top surface of the isolation wall is coated with a silicon nitride film, and the storage node layers project above the upper surface of the silicon nitride film.

The present invention is further directed to a capacitance element comprising a plurality of storage node layers insulated from each other, characterized in comprising: an insulation layer; a plurality of aperture portions formed at intervals from each other in the insulation layer; an isolation wall formed by the insulation layer sandwiched by the aperture portions; a silicon nitride layer formed at an upper portion of the isolation wall and projects like a hood from the isolation wall; a storage node layer formed so as to coat the inner surfaces of the aperture portions; a capacitor insulation film formed so as to coat the storage node layer; and a cell plate layer formed so as to coat the capacitor insulation film, wherein the capacitor insulation film is formed directly on the top surface and side surfaces of the silicon nitride layer.

The aperture portions are formed preferably in an approximately cylindrical shape.

As clearly described above, the manufacturing method according to the present invention makes it possible to prevent short-circuit between adjacent storage node layers which is caused by an adhering conductive foreign matter.

In addition, the capacitance element according to the present invention can reduce occurrence of failures in the market and improve the reliability of the capacitance element.

PREFERRED EMBODIMENTS OF THE INVENTION

First Embodiment

Figure 1:
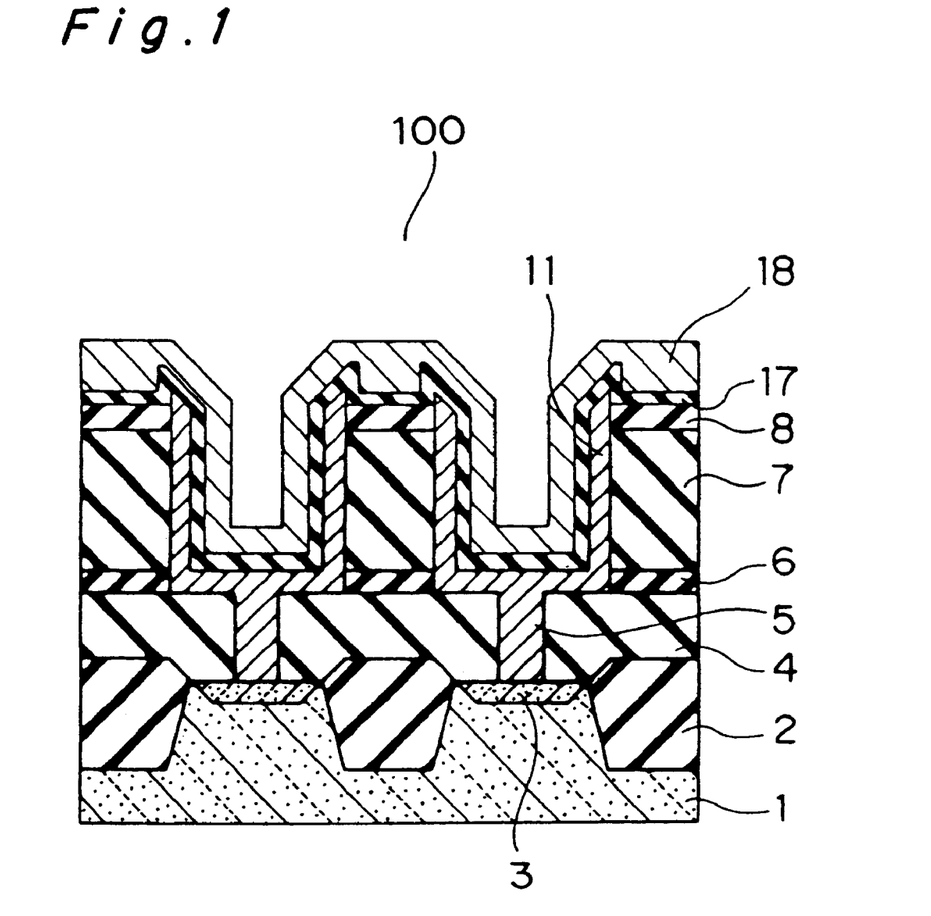
FIG. 1 is a cross sectional view of the capacitance element according to the first embodiment.

FIG. 1 is a cross sectional view of a capacitance element according to a first embodiment denoted generally at 100. FIGS. 2A–2E are cross sectional view of manufacturing steps of the capacitance element 100. A manufacturing method and a structure of the capacitance element 100 will now be described with reference to FIGS. 2A–2E.

Figure 2A:
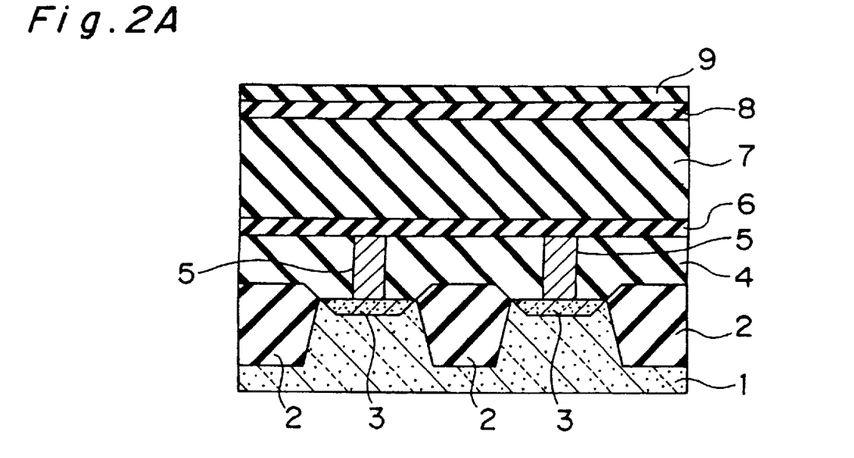
FIGS. 2A–2E are cross sectional view of the manufacturing steps of the capacitance element according to the first embodiment.

Among the manufacturing steps of the capacitance element 100 according to the embodiment, first, as shown in FIG. 2A, insulation regions 2 and active regions 3 sandwiched by the insulation regions 2 are formed on the surface of silicon substrate 1. Transistors (not shown), for example, are formed in the active regions 3.

Following this, a silicon oxide layer 4 is formed so as to cover the surface of the silicon substrate 1. Holes (not shown) are formed in the silicon oxide layer 4, and polycrystalline silicon is buried in the holes so that plugs 5 are formed.

Following this, a silicon nitride film 6 with a film thickness of 500 Å and an insulation layer 7, for instance, formed by a silicon oxide film with a film thickness of 15000 Å are deposited successively.

Further, a silicon nitride film 8 with a film thickness of 500 Å and a silicon oxide film 9 with a film thickness of 500 Å are formed on the insulation layer 7 successively.

Figure 2B:
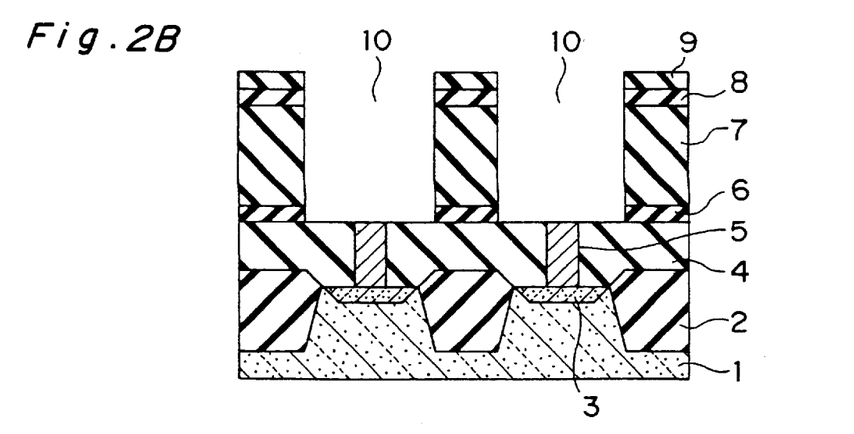

Next, as shown in FIG. 2B, the silicon oxide film 9, the silicon nitride film 8 and the insulation layer 7 are etched into an approximately cylindrical shape using a photoresist (not shown) as a mask, whereby aperture portions 10 are formed. At this etching step, the silicon nitride film 6 under the insulation layer 7 acts as an etching stopper for the insulation layer 7. The silicon nitride film 6 is thereafter removed at the bottom surfaces of the aperture portions 10, thereby exposing the silicon oxide layer 4 and the plugs 5.

The aperture portions 10 formed at this etching step are isolated from each other by isolation walls 20 formed by the insulation layer 7.

Figure 2C:
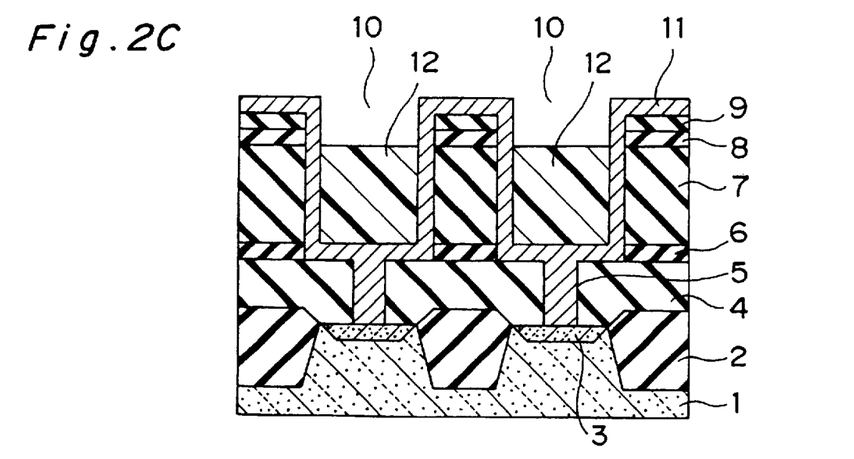

Next, as shown in FIG. 2C, a storage node (SN) layer 11 of polycrystalline silicon doped with phosphorus, for instance, is formed so as to cover the entire surface. The storage node layer 11 is electrically connected with the active regions 3 of the silicon substrate 1 through the plugs 5. A photoresist layer 12 is then buried in the aperture portions 10.

Figure 2D:
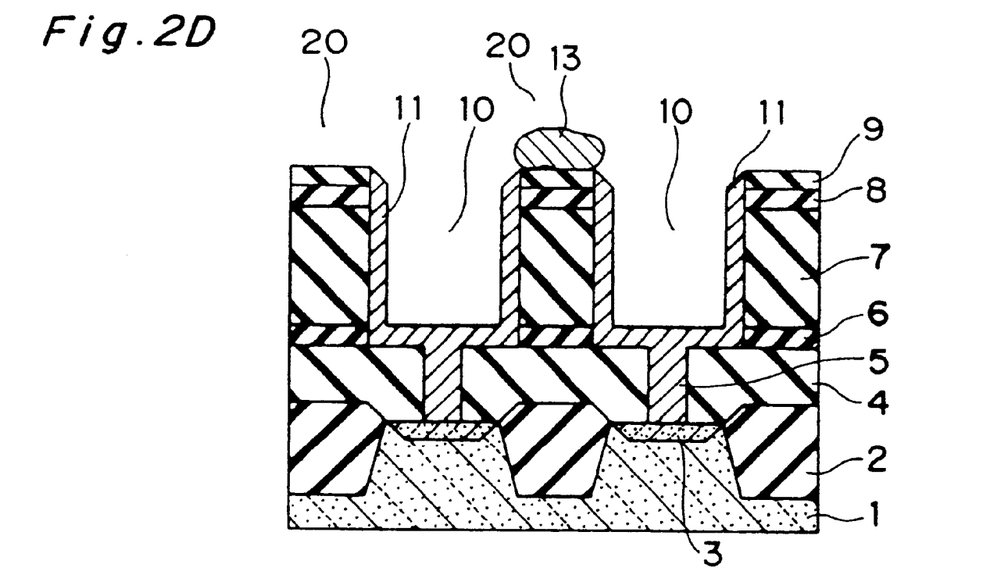

Next, as shown in FIG. 2D, the storage node layer 11 is etched using the photoresist layer 12 as a mask, leaving the storage node layer 11 only within the aperture portions 10. At the etching step shown in FIG. 2D, a conductive foreign matter 13 in an etching solution adheres to an upper portion of the silicon oxide film 9 on the isolation walls 20 and the adjacent storage nodes 11 short-circuit with each other.

Figure 2E:
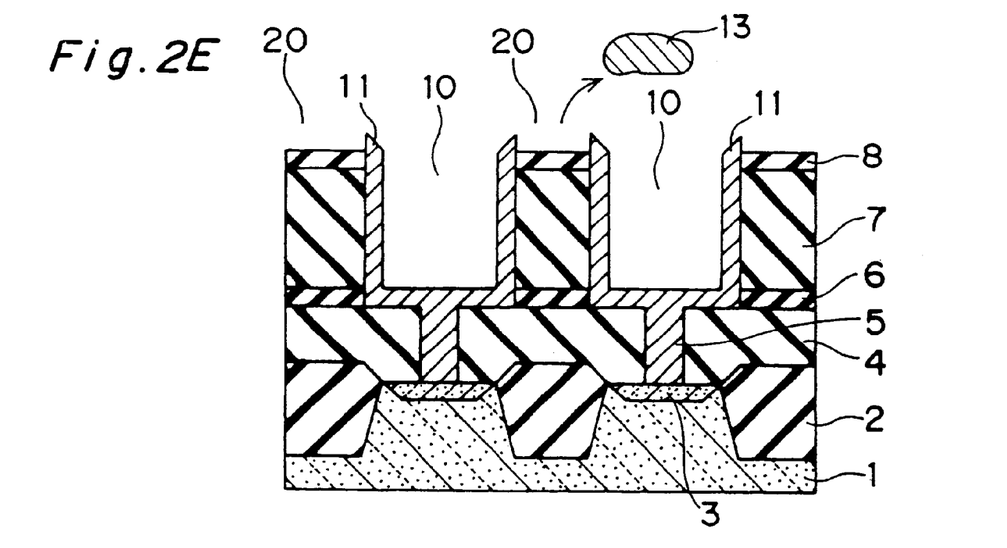

Next, as shown in FIG. 2E, the silicon oxide film 9 is removed by etching using a hydrofluoric acid solution, for instance. As a result of the etching step, the conductive foreign matter 13 adhering on the silicon oxide film 9 is also removed together with the silicon oxide film 9. The insulation layer 7 under the silicon oxide film 8 acts as an etching stopper.

At last, a capacitor insulation film 17 of silicon nitride and a cell plate layer 18 of polycrystal silicon, for example, are formed successively, whereby the capacitance element 100 shown in FIG. 1 is completed.

Using this manufacturing method, it is possible to prevent short-circuit between the adjacent storage node layers 11 due to the conductive foreign matter 13 adhering to upper portions of the isolation walls 20.

Second Embodiment

Figure 3:
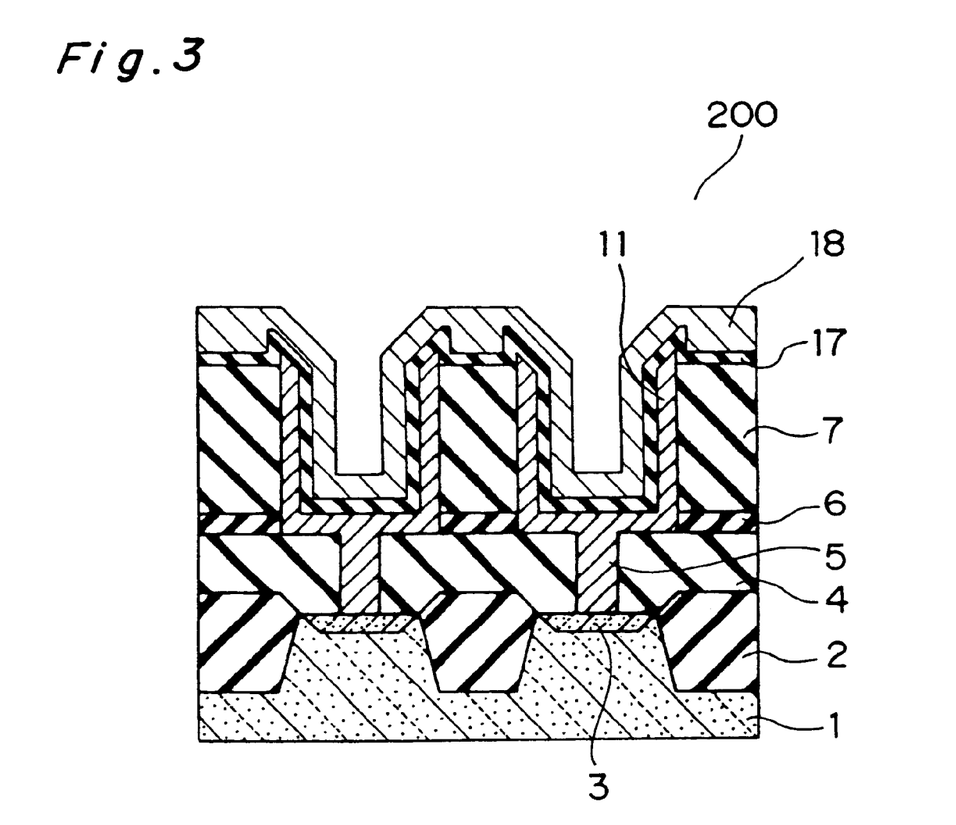
FIG. 3 is a cross sectional view of the capacitance element according to the second embodiment.

FIG. 3 is a cross sectional view of a capacitance element according to a second embodiment denoted generally at 200. FIGS. 4A–4D are cross sectional view of manufacturing steps of the capacitance element 200. A manufacturing method and a structure of the capacitance element 200 will now be described with reference to FIGS. 4A–4D.

Figure 4A:
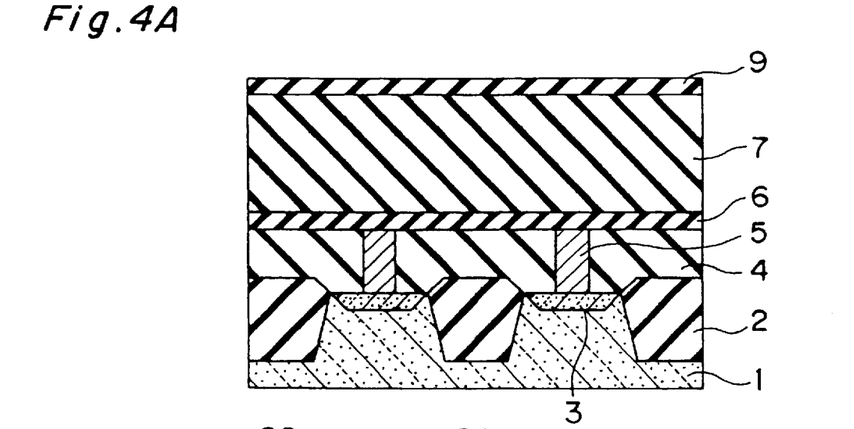
FIGS. 4A–4D are cross sectional view of the manufacturing steps of the capacitance element according to the second embodiment.

Among the manufacturing steps of the capacitance element 200 according to the embodiment, first, as shown in FIG. 4A, insulation regions 2 and active regions 3 are formed on the surface of silicon substrate 1, and a silicon oxide layer 4, plugs 5 and a silicon nitride film 6 are thereafter formed. These manufacturing steps are the same as those in the first embodiment.

Following this, an insulation layer 7 formed by a silicon oxide film, for instance, and having a film thickness of 15000 Å is formed. In the second embodiment, the insulation layer 7 is formed by a BPSG (Boro Phospho Silicate Glass) layer, a TEOS (Tetra Etyle Ortho Silicate) layer, a BPTEOS (Boro Phospho Tetra Etyle Ortho Silicate) layer or the like created by a CVD method.

Further, a silicon oxide film 9 with a film thickness of 500 Å is formed on the insulation layer 7. In the second embodiment, the silicon oxide film 9 is formed by SOG (Spin On Glass) or the like created by a coating method.

Figure 4B:
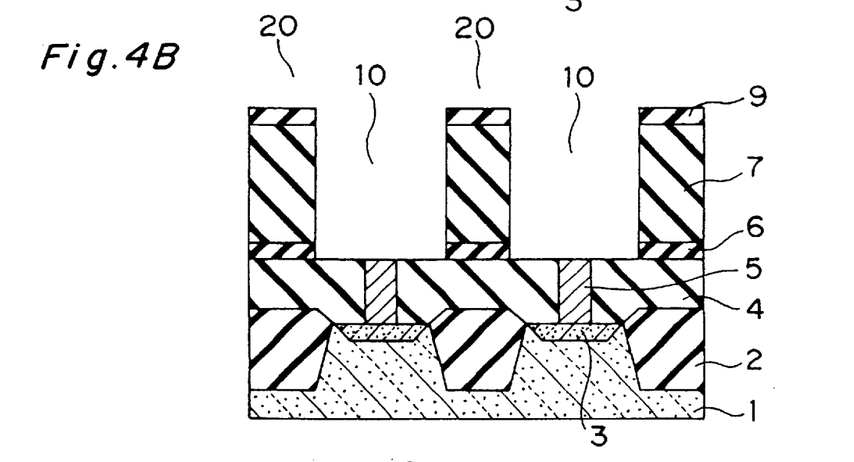

Next, as shown in FIG. 4B, aperture portions 10 isolated from each other by isolation walls 20 are formed through a step similar to that in the first embodiment.

Figure 4C:
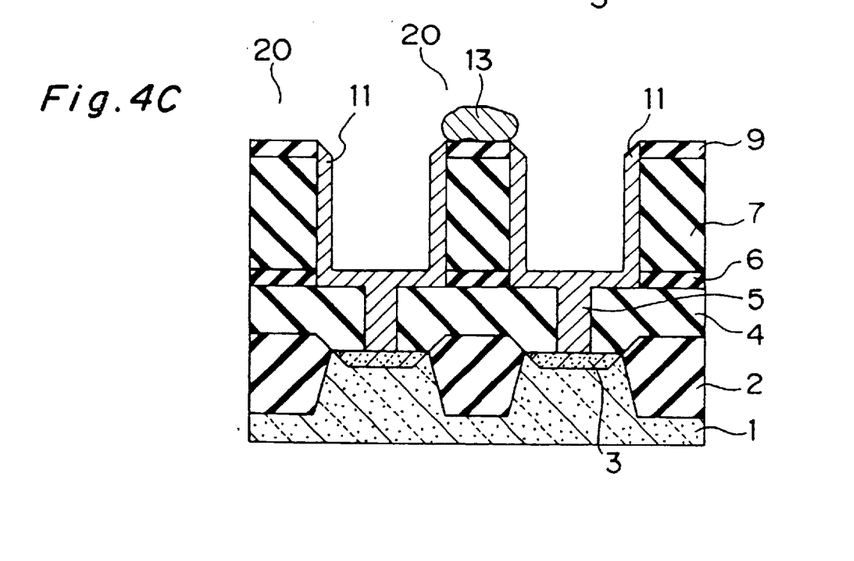

Next, as shown in FIG. 4C, after forming a storage node layer 11 over the entire surface at a step similar to that in the first embodiment, the storage node layer 11 is etched using a photoresist layer (not shown) buried in the aperture portions 10 as a mask, whereby the storage node layer 11 remains only within the aperture portions 10.

At the etching step shown in FIG. 4C, a conductive foreign matter 13 in an etching solution adheres to top ends of the isolation walls 20, and short-circuits adjacent storage node layers 11.

Figure 4D:
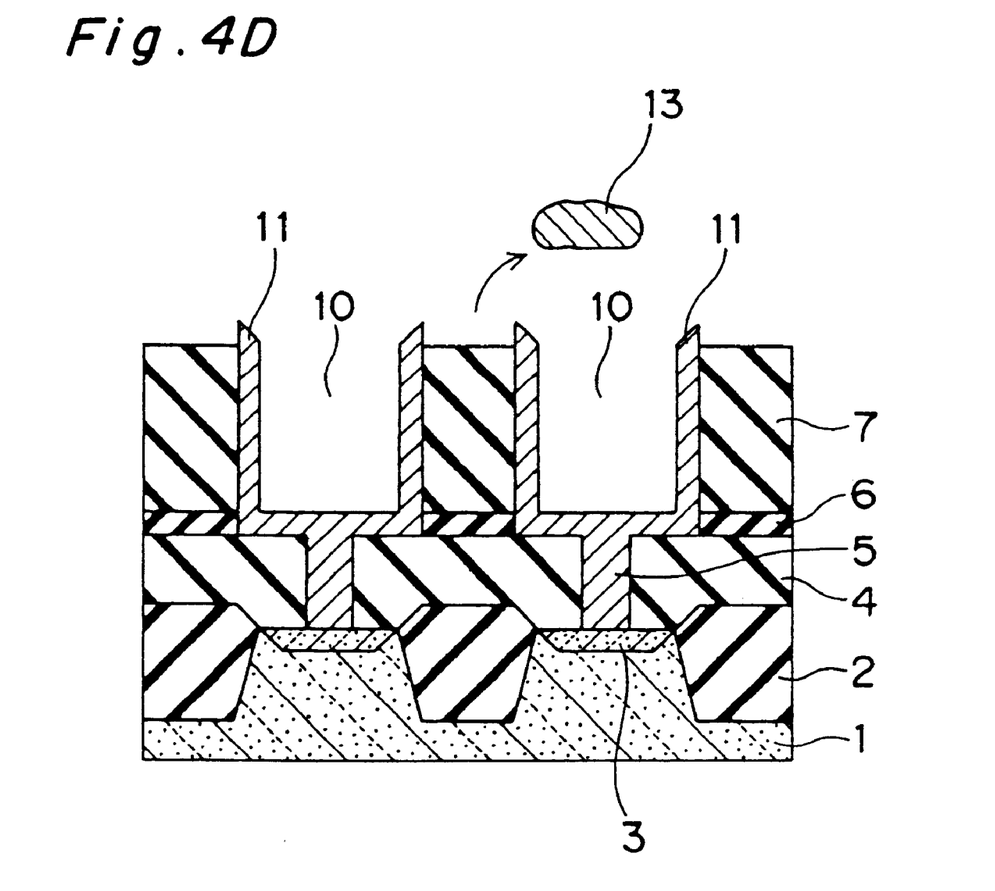

Next, as shown in FIG. 4D, the silicon oxide film 9 is selectively etched using a hydrofluoric acid solution.

More specifically, the silicon oxide film 9 is etched for 20 seconds using an etching solution of hydrofluoric acid ($H_2O$:HF=100:1 (in volume rate)). While an etching rate of the etching solution working upon the insulation layer 7 formed by a BPSG layer, a TEOS layer or the like is approximately 300 Å/min, an etching rate upon the silicon oxide film 9 formed by an SOG film or the like is 3000 Å/min.

Hence, the etching for 20 seconds completely removes the silicon oxide film 9 with a film thickness of 500 Å. On the other hand, the insulation layer 7 is etched only about 50 Å after the silicon oxide film 9 is removed. This makes it possible to substantially remove the silicon oxide film 9 in a selective manner.

At the etching step, the conductive foreign matter 13 adhering on the silicon oxide film 9 as well is removed together with the silicon oxide film 9.

At last, a capacitor insulation film 17 of silicon nitride and a cell plate layer 18 of polycrystalline silicon, for example, are formed successively, whereby the capacitance element 200 shown in FIG. 3 is completed.

Using this manufacturing method, it is possible to prevent short-circuit between the adjacent storage node layers 11 due to the conductive foreign matter 13 adhering to upper portions of the isolation walls 20.

Third Embodiment

Figure 5:
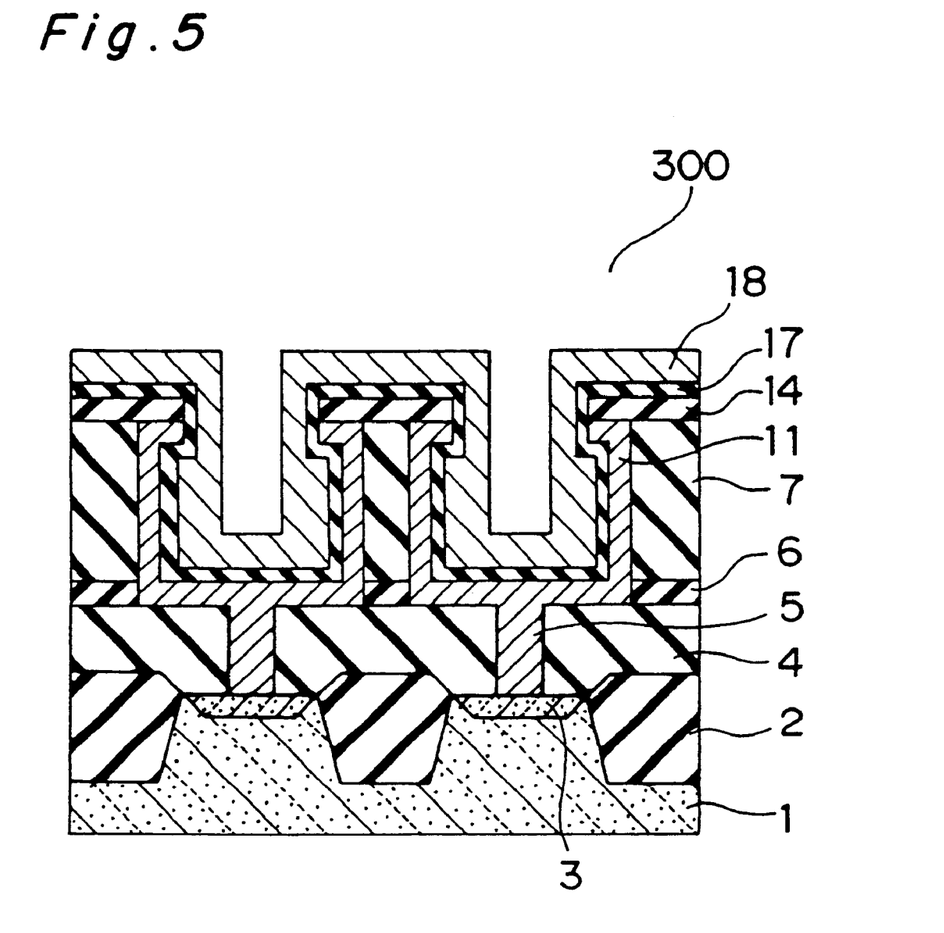
FIG. 5 is a cross sectional view of the capacitance element according to the third embodiment.

FIG. 5 is a cross sectional view of a capacitance element according to the third embodiment denoted generally at 300. FIGS. 6A–6F are cross sectional view of manufacturing steps of the capacitance element 300. A manufacturing method and a structure of the capacitance element 300 will now be described with reference to FIGS. 6A–6F.

Figure 6A:
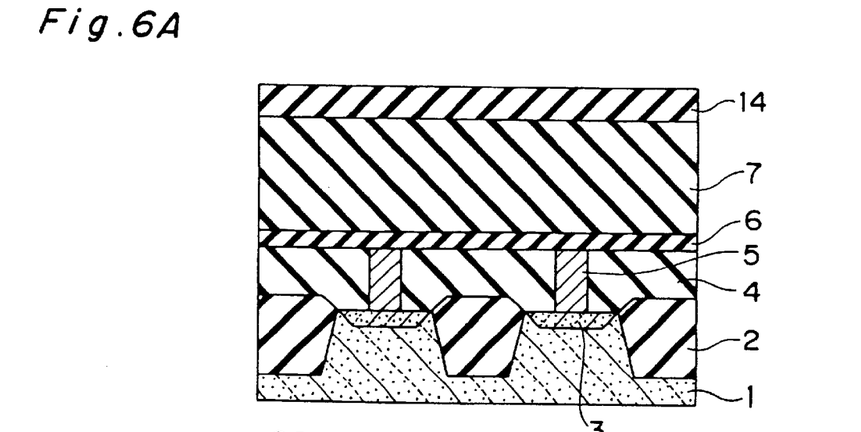
FIGS. 6A–6F are cross sectional view of the manufacturing steps of the capacitance element according to the third embodiment.

Among the manufacturing steps of the capacitance element 300, first, as shown in FIG. 6A, insulation regions 2 and active regions 3 are formed on the surface of silicon substrate 1, and a silicon oxide layer 4, plugs 5 and a silicon nitride film 6 are thereafter formed. Following this, an insulation layer 7 formed by a silicon oxide film, for instance, and having a film thickness of 15000 Å is formed. These manufacturing steps are the same as those in the first embodiment.

A silicon nitride film 14 with a film thickness of 1500 Å is thereafter formed on the insulation layer 7.

Figure 6B:
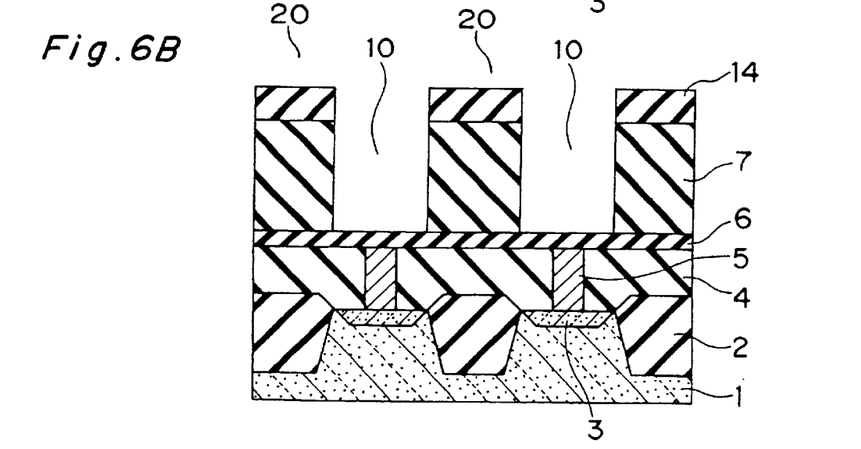

Next, as shown in FIG. 6B, aperture portions 10 isolated from each other by isolation walls 20 are formed through a step similar to that in the first embodiment.

Figure 6C:
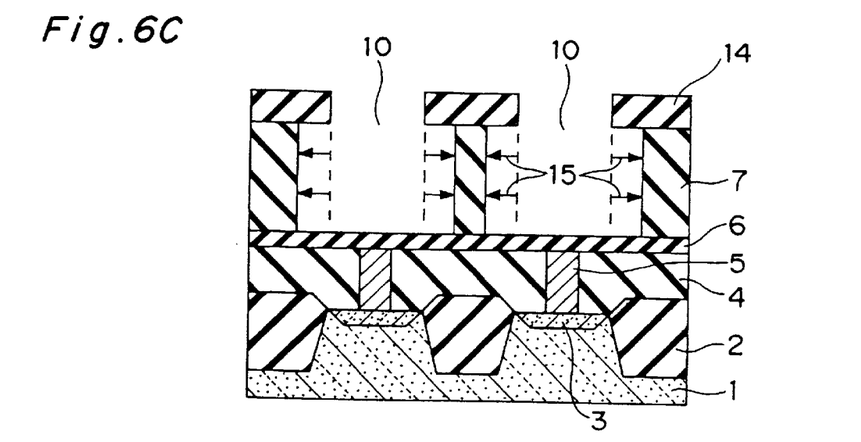

Next, as shown in FIG. 6C, the insulation layer 7 is selectively etched approximately 700 Å, in a direction denoted at an arrow 15, using a hydrofluoric acid solution. In consequence, the silicon nitride film 14 projects like a hood from an upper portion of the insulation layer 7.

Figure 6D:
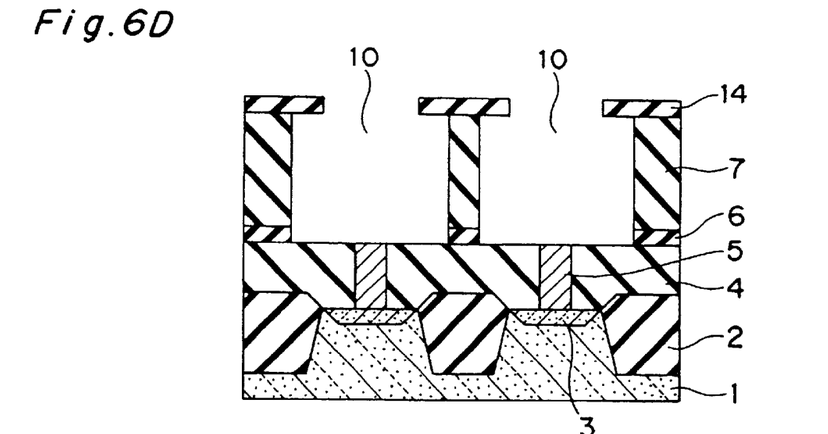

Next, as shown in FIG. 6D, the silicon nitride film 6 at bottom surfaces of the aperture portions 10 is etched, thereby exposing the silicon oxide layer 4 and the plugs 5. At this step, the silicon nitride film 14 is also etched into a film thickness of about 500 Å.

Figure 6E:
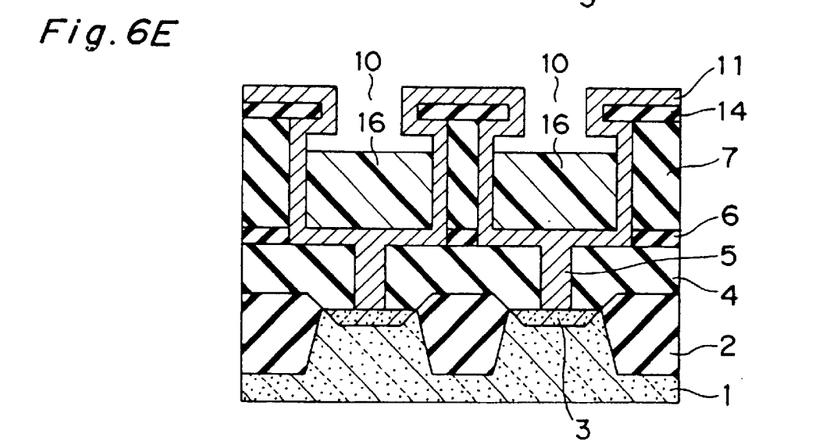

Next, as shown in FIG. 6E, using a CVD method, for example, a storage node layer 11 of polycrystalline silicon is formed on the insulation layer 7 and the silicon nitride film 14. Following this, a photoresist layer 16 is formed so as to fill up the aperture portions 10.

Figure 6F:
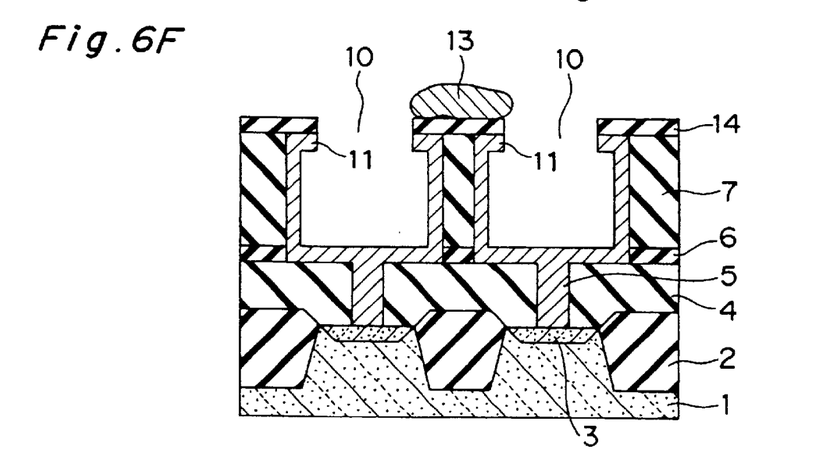

Next, as shown in FIG. 6F, using the photoresist layer 16 as a mask, the storage node layer 11 is etched back. The storage node layer 11 is removed so that the storage node layer 11 does not remain on the top surface and side surfaces of the silicon nitride film 14.

After the etch back step, as shown in FIG. 6F, since the silicon nitride film 14 insulates the storage node layers 11 from each other even if a conductive foreign matter 13 adheres onto the silicon nitride film 14, no short-circuit occurs between the adjacent storage node layers 11.

At last, a capacitor insulation film 17 of silicon nitride and a cell plate layer 18 of polycrystalline silicon, for example, are formed successively, whereby the capacitance element 300 shown in FIG. 5 is completed.

Using this manufacturing method, it is possible to prevent short-circuit between the adjacent storage node layers 11 due to the conductive foreign matter 13 adhering to upper portions of the isolation walls 20.

What is claimed is:

1. A manufacturing method of a capacitance element in which a plurality of aperture portions are formed in an insulation layer on a semiconductor substrate and a storage node layer is formed at the inner surfaces of said aperture portions, comprising the steps of:

forming an insulation layer on a semiconductor substrate;

forming a silicon oxide film on said insulation layer;

forming a plurality of aperture portions in said insulation layer from the surface of said silicon oxide film;

forming a conductive layer so as to cover said insulation layer and said silicon oxide film;

removing said conductive layer on said silicon oxide film so that said conductive layer remaining inside said aperture portions becomes storage node layers;

removing said silicon oxide film; and successively forming a capacitor insulation film and a cell plate layer so as to cover said storage node layers.

2. The manufacturing method according to claim 1, further comprising a step of forming a silicon nitride film between said insulation layer and said silicon oxide film, wherein said step of removing silicon oxide film is a step of etching back said silicon oxide film using said silicon nitride film as an etching stopper.

3. The manufacturing method according to claim 1, wherein said insulation layer is formed by a CVD silicon oxide layer formed by a CVD method while said silicon oxide film is formed by a coated silicon oxide film formed by a coating method, and said step of removing silicon oxide film is a step of selectively etching said coated silicon oxide film using a hydrofluoric acid solution.

4. The manufacturing method according to claim 3, wherein said CVD silicon oxide layer is formed by one layer selected between a BPSG layer and a TEOS layer, and said coated silicon oxide layer is formed by a SOG film.

5. A manufacturing method of a capacitance element in which a plurality of aperture portions are formed in an insulation layer on a semiconductor substrate and a storage node layer is formed at the inner surfaces of said aperture portions, comprising the steps of:

forming an insulation layer on a semiconductor substrate;

forming a silicon nitride film on said insulation layer;

forming a plurality of aperture portions in said insulation layer from the surface of said silicon nitride film;

selectively etching said insulation layer at side walls of said aperture portions while coating the surface of said insulation layer with said silicon nitride film so that said silicon nitride film projects like a hood from the top surface of said insulation layer;

forming a conductive layer so as to cover said insulation layer and said silicon nitride film;

selectively removing said conductive layer on the top surface and side surfaces of said silicon nitride film so that said conductive layer remaining inside said aperture portions becomes storage node layers; and successively forming a capacitor insulation film and a cell plate layer so as to cover said storage node layers.

6. The manufacturing method according to claim 5, wherein said insulation layer is formed by a silicon oxide layer, and said selective etching step is a step of selectively etching, with a hydrofluoric acid solution, said silicon oxide film at said side walls of said aperture portions using said silicon nitride film as an etching mask.

\* \* \* \* \*